United States Patent
Cazaux

(10) Patent No.: US 6,831,264 B2
(45) Date of Patent: Dec. 14, 2004

(54) CMOS PHOTODETECTOR INCLUDING AN AMORPHOUS SILICON PHOTODIODE AND A SATURATION SYSTEM

(75) Inventor: Yvon Cazaux, Grenoble (FR)

(73) Assignee: STMicroelectronics S.A., Montrouge (FR)

(*) Notice: Subject to any disclaimer, the term of this patent is extended or adjusted under 35 U.S.C. 154(b) by 98 days.

(21) Appl. No.: 10/142,262

(22) Filed: May 8, 2002

(65) Prior Publication Data

US 2002/0185589 A1 Dec. 12, 2002

(30) Foreign Application Priority Data

May 9, 2001 (FR) .............................................. 01 06131

(51) Int. Cl.⁷ .............................................. H01L 31/00
(52) U.S. Cl. .................................................. 250/214 R
(58) Field of Search ......................... 250/214.1, 214 C, 250/208.1, 214 R

(56) References Cited

U.S. PATENT DOCUMENTS 6,133,563 A * 10/2000 Clark et al. .............. 250/208.1

FOREIGN PATENT DOCUMENTS

| EP | 0928101 | 7/1999 |
| EP | 0964570 | 12/1999 |
| EP | 1026747 | 8/2000 |
| GB | 2347212 | 8/2000 |

* cited by examiner

Primary Examiner—Thanh X. Luu
(74) Attorney, Agent, or Firm—Lisa K. Jorgenson; Robert Iannucci; Seed IP Law Group PLLC

(57) ABSTRACT

A photodetector including an amorphous silicon photodiode having its anode connected to a reference voltage, an initialization MOS transistor connected between the cathode of the photodiode and a first supply voltage to set the cathode to the first supply voltage during an initialization phase, and means for measuring the voltage of the photodiode cathode, including saturation means for bringing the photodiode cathode to a saturation voltage close to the reference voltage immediately before the initialization phase.

12 Claims, 3 Drawing Sheets

CMOS PHOTODETECTOR INCLUDING AN AMORPHOUS SILICON PHOTODIODE AND A SATURATION SYSTEM

BACKGROUND OF THE INVENTION

1. Field of the Invention

The present invention relates to the monolithic forming of image sensors intended to be used in shooting devices such as, for example, cameras, camcorders, digital microscopes, or digital photographic cameras. More specifically, the present invention relates to image sensors formed in CMOS technology.

2. Description of the Related Art

An image sensor formed in CMOS technology generally includes a matrix of photodetectors arranged at the intersection of lines and columns.

FIG. 1 schematically shows an example of a CMOS-type photodetector of an image sensor matrix. A photodiode D has its anode connected to a low reference voltage VSS. The cathode of photodiode D is connected to a detection node SN. An initialization MOS transistor T1 and a MOS measurement transistor T2, with N channels, have their drain connected to a high supply voltage VDD. The source of transistor T1 and the gate of transistor T2 are connected to detection node SN. The gate of transistor T1 receives a signal NI controlling the initialization of node SN. An N-channel MOS transistor T3 has its drain connected to the source of transistor T2. The gate of transistor T3 receives a line selection signal LS. The source of transistor T3 is connected to a read means 2. Read means 2 receives a read control signal ST. Means 2 is connected to other photodiodes, not shown, of the matrix.

The photodiode D of a photodetector such as in FIG. 1 may be formed in the same substrate as the other photodetector elements. Its light-receiving surface area must be sufficient to ensure a good detection, the surface area occupied by the other photodetector elements reducing the number of photons captured by the photodiode. To increase the surface area of the photodiode without increasing the total surface area of a photodetector, a solution consists of forming the photodiode above the other photodetector elements.

FIG. 2 schematically shows as an example a cross-section view of a photodiode D and of a MOS initialization transistor T1 of a photodetector, in which the photodiode is formed above the other photodetector elements. For readability reasons, the drawings representing the different semiconductor regions are not drawn to scale. Transistor T1 is formed in a P-type active area 4 delimited by a silicon oxide ($SiO_2$) field insulation region 8. On either side of an insulated gate 10, are N-type source and drain regions 12 and 14 of transistor T1. Transistor T1 is covered with a layer 16 of an insulator ($SiO_2$). Above layer 16 is formed an amorphous silicon layer including a lower region 18, an intermediary intrinsic layer 20, and an upper P-type layer 22, to form a PIN-type photodiode. Layer 22 forms the anode of the photodiode and region 18 forms the cathode of the photodiode. Layer 22 is covered with a conductive transparent ITO layer 24 connected to voltage VSS. Region 18 is connected by a conductive via 28 to source region 12. A conductive region 26 may be arranged under region 18.

FIG. 3 illustrates, in a phase of measurement of the light received by the photodetector of FIG. 1, the variations along time of signals LS and NI, of voltage VSN of node SN, and of signal ST. Transistor T2 is assembled as a follower of voltage VSN of node SN. For simplicity, it is assumed hereafter that transistor T2 has a unity gain and that the source voltage of transistor T2 is substantially equal to voltage VSN. It is thus considered that read means 2, connected to the source of transistor T2 via transistor T3, enables storing voltage VSN.

At a time t0, selection signal LS is at 1 so that transistor T3 is on and that the source of transistor T2 is connected to read means 2. Read signal ST is at 0 and read means 2 is deactivated. At time t0, initialization signal NI is brought to 1, for a short initialization duration, to bring voltage VSN to VDD. At the end of this initialization, signal NI falls back to 0. Voltage VSN then drops by a voltage $\Delta 0$, especially due to the capacitive coupling existing between the gate and the source of transistor T1, as well as to noise introduced by transistor T1.

At a time t1, after signal NI has returned to 0, signal ST is activated after a short time to control the reading of voltage VDD-$\Delta 0$ by means 2. From the time when transistor T1 is no longer on and when the photodiode cathode is no longer connected to VDD, and if photodiode D is submitted to a light radiation, electrons accumulate at the photodiode cathode. Voltage VSN of the cathode then decreases proportionally to the received light.

At a time t2, signal LS is brought to 0 to turn transistor T3 off and to isolate the photodetector from means 2. Means 2 can then be connected to another photodetector of the image sensor.

At a time t3, after a predetermined duration during which the photodiode is submitted to a light radiation which is desired to be measured, signal LS is brought back to 1 and transistor T3 is turned on.

At a time t4, signal ST is shortly activated to control the reading of voltage VSN by means 2. Voltage VSN then has a value VDD-$\Delta 0$-$\Delta 1$, where $\Delta 1$ depends on the number of photons received by the photodiode and on a negligible thermal noise. The measurement of VDD-$\Delta 0$-$\Delta 1$ is subtracted to the preceding measurement of VDD-$\Delta 0$ to know value $\Delta 1$ and thus the light received by the photodiode between times t1 and t4.

An amorphous silicon diode includes charge traps likely to store electrons for a so-called relaxation time. In each light measurement phase such as described in FIG. 3, part of the electrons accumulated in the photodiode cathode between times t1 and t4 are immobilized by the charge traps of the photodiode. Value $\Delta 1$ measured at the end of the measurement phase does not take into account the electrons stored in the charge traps, and the measurement is vitiated. Further, the duration of connection to voltage VDD during the initialization phase is insufficient to empty all the charge traps. Thus, at the beginning of each measurement phase, charge traps contain an amount of parasitic electrons which depends on the light received in one or several preceding measurement phases. These parasitic electrons, which are released at the end of the charge trap relaxation time, vitiate measured value $\Delta 1$. The value $\Delta 1$ measured at the end of each measurement phase thus partly depends on the light received in the preceding measurement phase(s). In an image sensor including a photodetector matrix, this electron retention phenomenon causes a remanence or a decay of the image. The significance of the decay especially depends on the amount of traps in the photodiode and of the average electron retention duration of these traps.

A known solution to suppress this decay phenomenon consists of limiting the number of traps in photodiode D. This solution implies forming photodiode D in a custom-made amorphous silicon, and implies a costly lengthening of the circuit manufacturing duration.

BRIEF SUMMARY OF THE INVENTION

An embodiment of the present invention provides a CMOS photodetector including an amorphous silicon photodiode of simple structure, with a low-cost manufacturing, and which does not cause a decay phenomenon such as previously described.

The photodiode has its anode connected to a reference voltage and the photodetector further includes, an initialization MOS transistor connected between the cathode of the photodiode and a first supply voltage to set the cathode to the first supply voltage during an initialization phase, and means for measuring the voltage of the cathode of the photodiode, including saturation means for bringing the photodiode cathode to a saturation voltage close to the reference voltage immediately before the initialization phase.

According to an embodiment of the present invention, the source of the initialization MOS transistor is connected to the cathode of the photodiode and the photodetector includes a branching means adapted to bringing the drain of the initialization MOS transistor to the saturation voltage or to the first supply voltage.

According to an embodiment of the present invention, the initialization MOS transistor is controlled in low-inversion state.

According to an embodiment of the present invention, the initialization MOS transistor is controlled in strong-inversion state.

According to an embodiment of the present invention, the measurement means includes a measurement MOS transistor having its gate connected to the photodiode cathode, and a control MOS transistor connected in series with the measurement MOS transistor between a second supply voltage and a read means.

According to an embodiment of the present invention, the first and second supply voltages are equal.

Another embodiment of the present invention provides a method for measuring the light received by a photodetector including an amorphous silicon photodiode having its anode connected to a reference voltage, including the successive steps of:

a/ bringing the photodiode cathode to a saturation voltage close to the reference voltage;

b/ bringing the photodiode cathode to a supply voltage, then electrically isolating the cathode;

c/ performing a first measurement of the cathode voltage of the photodiode immediately after electrically isolating the cathode;

d/ submitting the photodiode to a light radiation for a determined duration; and e/ performing a second measurement of the cathode voltage of the photodiode and subtracting the second measurement to the first measurement.

The foregoing objects, features and advantages of the present invention will be discussed in detail in the following non-limiting description of specific embodiments in connection with the accompanying drawings. Other features and advantages of the invention will become apparent from the following detailed description, taken in conjunction with the accompanying drawings.

DETAILED DESCRIPTION OF THE INVENTION

Same elements have been designated with the same references in the different drawings. Only those elements which are necessary to the understanding of one or more embodiments of the present invention have been shown in the different drawings.

Figure 1:
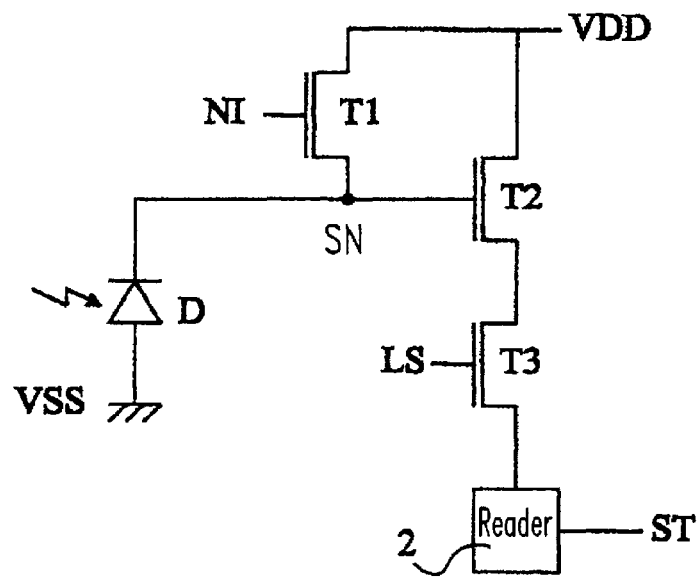
FIG. 1, previously described, shows a CMOS-type photodetector circuit.
Figure 2:
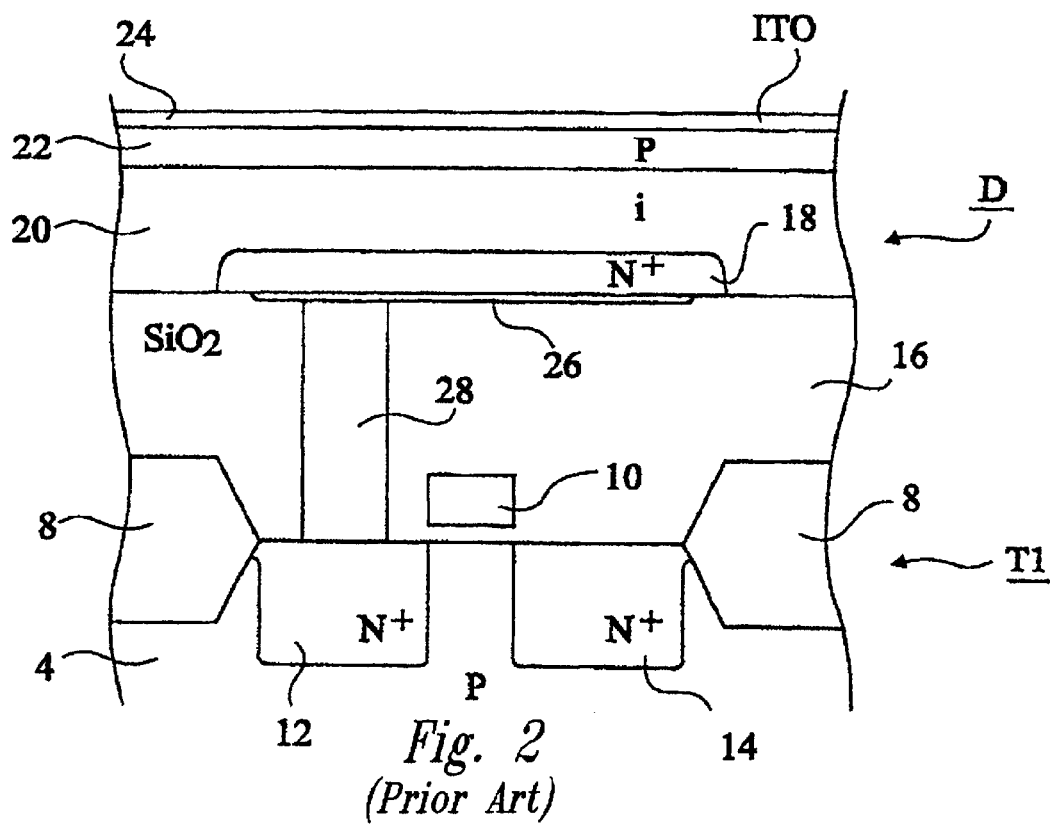
FIG. 2, previously described, schematically shows a cross-section view of the photodetector of FIG. 1.
Figure 3:
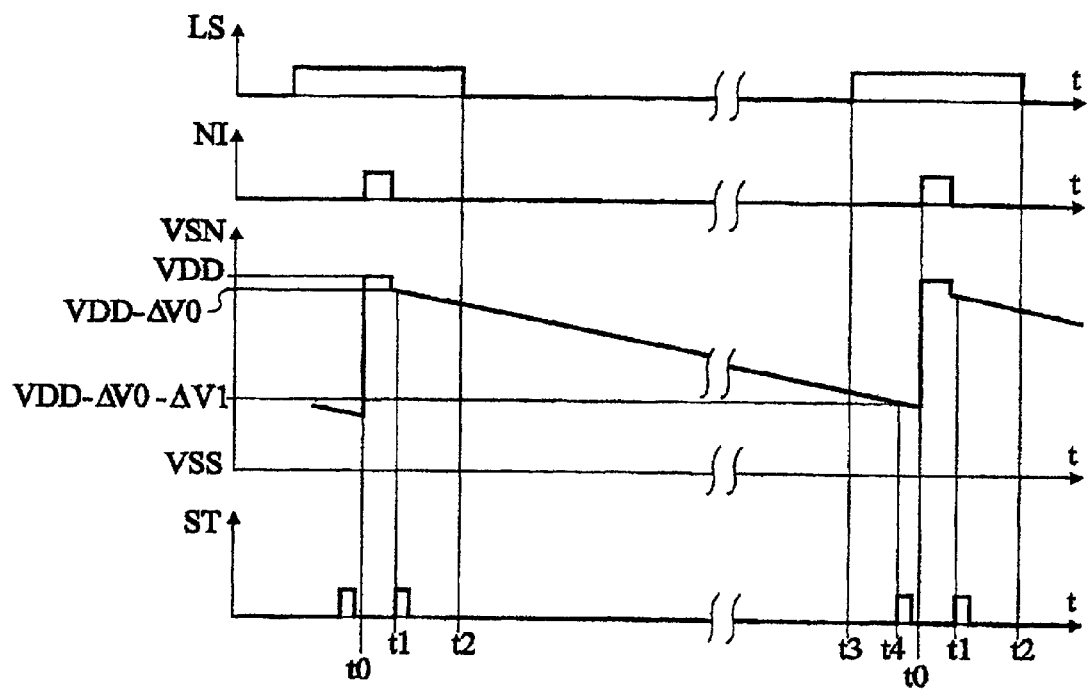
FIG. 3, previously described, illustrates the operation of the photodetector of FIG. 1.
Figure 4:
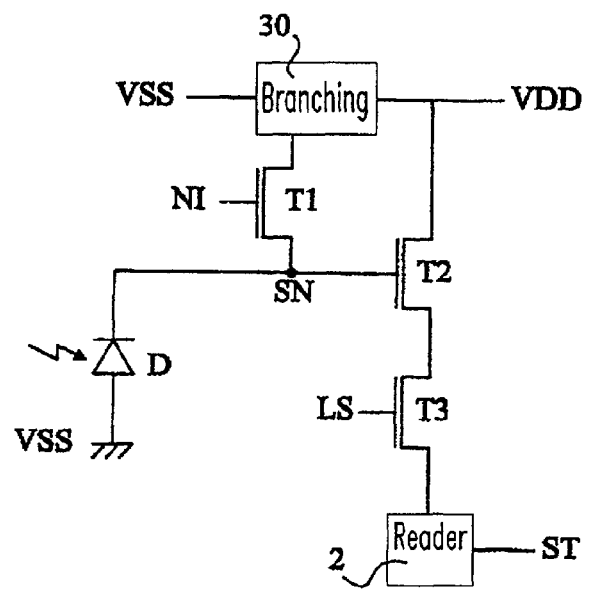
FIG. 4 schematically shows a photodetector circuit according to an embodiment of the present invention.

FIG. 4 schematically shows a photodetector circuit according to an embodiment of the present invention. The photodetector includes a PIN-type amorphous silicon photodiode D and a transistor T1 such as shown in FIG. 2. The gate of transistor T1 receives a control signal NI. The drain of transistor T1 is connected to a branching means 30, controllable by means not shown, provided to bring the drain of transistor T1 to voltage VDD or to voltage VSS. An N-channel measurement MOS transistor T2 has its drain connected to voltage VDD and its gate connected to cathode SN of photodiode D. An N-type control transistor T3 is connected between the source of transistor T2 and a read means 2 controlled by a signal ST. The gate of transistor T3 receives a control signal LS.

Figure 5:
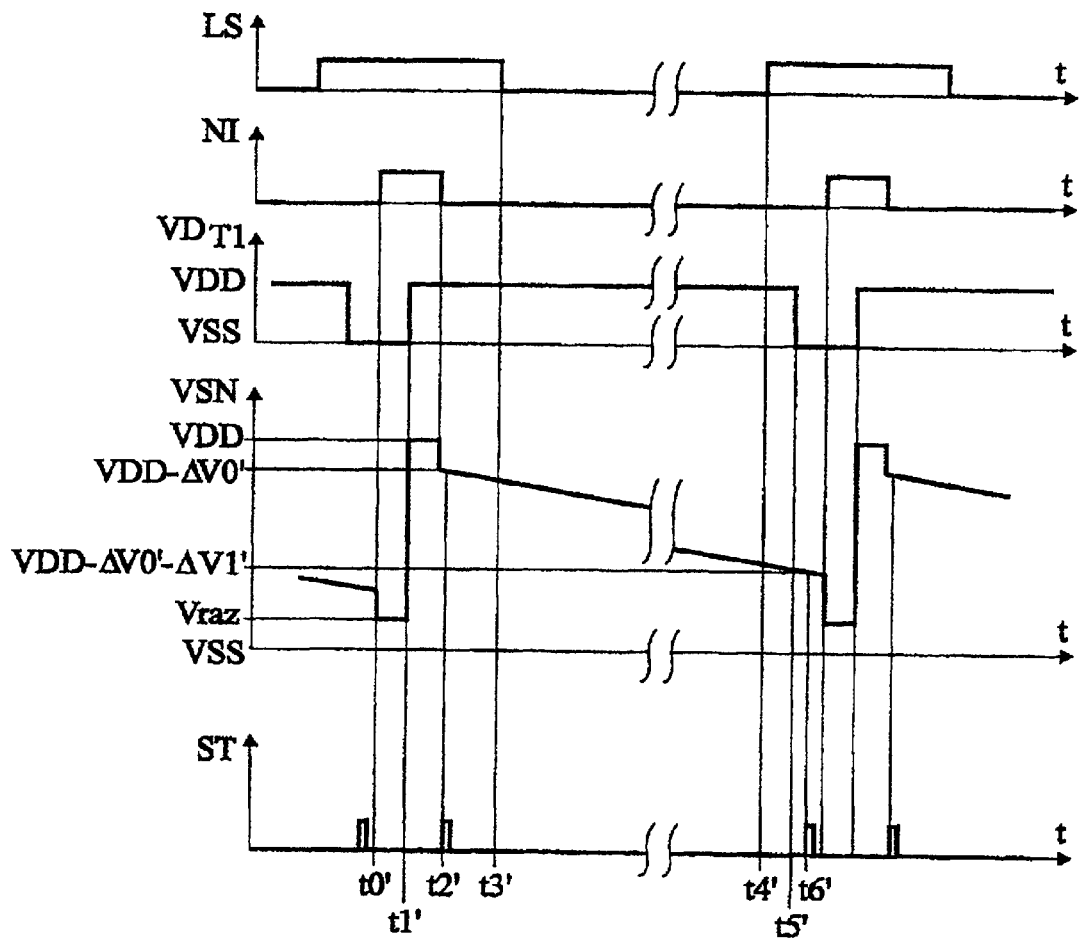
FIG. 5 illustrates the operation of the photodetector of FIG. 4.

FIG. 5 illustrates, in a phase of measurement of the light received by the photodiode of the detector of FIG. 4, the variation along time of signals LS and NI, of voltage $VD_{T1}$ of the drain of transistor T1, of voltage VSN of the cathode of photodiode D, and of control signal ST.

At a time t0', at the beginning of the measurement phase, signal LS is at a level 1 so that transistor T3 is on. Branching means 30 is in a state such that the drain of transistor T1 is connected to voltage VSS. At time t0', signal NI is brought to 1 to turn on transistor T1 and to bring cathode SN of the photodiode to a low voltage Vraz. Voltage Vraz is substantially equal to voltage VSS increased by threshold voltage VT of transistor T1. Lowering the voltage of cathode SN to voltage Vraz amounts to providing a large amount of electrons to cathode SN. Cathode SN is maintained at voltage Vraz until a time t1', for a duration sufficient for the charge trap levels of the cathode to be "saturated". Thus, at each time t1', the charge traps are in a determined maximum retention state, whatever the previous lighting of the photodiode. The "memory" of the preceding image contained in the amorphous silicon photodiode traps is thus deleted.

At time t1', branching means 30 is controlled to bring the drain of transistor T1 to voltage VDD. The cathode of the photodiode is then brought to a voltage substantially equal to voltage VDD. This step corresponds to an initialization of the photodiode before a new integrated phase starts. After a predetermined initialization duration, signal NI is brought to 0. Voltage VSN then drops by a voltage Δ0' especially due to the capacitive coupling between the gate and the source of transistor T1.

At a time t2', little after signal NI has been brought to 0, means 2 is controlled to store value VDD-Δ0' of voltage VSN.

At a time t3', signal LS is brought to 0 to turn off transistor T3. Read means 2 is then isolated from the photodetector and it can be connected to another photodetector of the matrix.

At a time t4', after a predetermined duration during which the photodiode is submitted to a light radiation, signal LS is brought to 1 to turn transistor T3 on and connect read means 2 to the photodetector.

At a time t5', branching means 30 is controlled to bring the transistor drain to voltage VSS.

At a time t6', means 2 is controlled to store the voltage of node SN, equal to VDD-66 0'-Δ1'. All the charge traps being initially saturated, the amount of electrons that they release between times t2' and t6' is independent from the preceding measurement phases. Considering that the amount of electrons released by the traps does not fluctuate along time, voltage Δ1' only varies according to the light received by the photodiode between times t2' and t4'. The subtraction of the measurements performed at times t6' and t2' enables determining value Δ1'. A photodetector according to an embodiment of the present invention thus enables providing a voltage, the variation of which only depends on the light received during each measurement period, which enables suppressing the previously-discussed decay phenomenon.

For simplicity, one or more embodiments of the present invention have been described in the case where the amount of electrons released by the traps does not fluctuate along time. In practice, this amount of electrons may fluctuate and introduce a time noise in proportion with the light received by the photodiode.

For simplicity, one or more embodiments of the present invention have been described in the case where voltage Vraz enables saturating all charge traps of the cathode of the photodiode. In practice, a quasi-saturation will be sufficient.

Of course, one or more embodiments of the present invention are likely to have various alterations, modifications, and improvements, which will readily occur to those skilled in the art. In particular, one or more embodiments of the present invention have been described in relation with a specific type of amorphous silicon diode, but those skilled in the art will readily adapt the present invention to any type of amorphous silicon photodiode, and more generally to any type of photodiode including charge traps.

One or more embodiments of the present invention have been described in relation with a specific sequencing of the operations of saturation of the photodiode charge traps, of initialization and measurement of the photodiode cathode voltage, but those skilled in the art will readily adapt one or more embodiments of the present invention to other sequencings. As an example, the operation of saturation of the photodiode charge traps may be carried out in the middle of the photodiode voltage initialization phase. Similarly, the duration of the different phases has not been specified, but those skilled in the art will easily determine them.

One or more embodiments of the present invention have been described in relation with all-or-nothing or strong inversion controls of transistor T1, but those skilled in the art will readily adapt one or more embodiments of the present invention to low-inversion controls of transistor T1, for example, to reduce the noise introduced by the transistors.

One or more embodiments of the present invention have been described in relation with a case where transistor T2 has a unity gain and where the voltage of the source of transistor T2 is substantially equal to voltage VSN, but those skilled in the art will readily adapt one or more embodiments of the present invention to a case where transistor T2 has a non-unity gain and where the source voltage of transistor T2 is not equal to voltage VSN.

One or more embodiments of the present invention have been described in relation with N-channel transistors, but those skilled in the art will readily adapt one or more embodiments of the present invention to P-channel transistors.

One or more embodiments of the present invention have been described in relation with a case in which the drain of transistor T1 can be brought to a high voltage VDD identical to the high voltage to which the drain of transistor T2 is connected, but those skilled in the art will easily adapt one or more embodiments of the present invention to a case in which the two high voltages are different.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photodetector, comprising:
    an amorphous silicon photodiode having an anode connected to a reference voltage;
    an initialization MOS transistor connected between a cathode of the photodiode and a first supply voltage, the initialization MOS transistor configured to set the cathode to the first supply voltage during an initialization phase;
    measurement means for measuring a voltage of the cathode of the photodiode; and
    saturation means for bringing the photodiode cathode to a saturation voltage close to the reference voltage immediately before the initialization phase.

2. The photodetector of claim 1, wherein a source of the initialization MOS transistor is connected to the cathode of the photodiode, wherein the saturation means includes branching means structured to bring a drain of the initialization MOS transistor alternately to the saturation voltage and to the first supply voltage.

3. The photodetector of claim 2, wherein the initialization MOS transistor is controlled in low-inversion state.

4. The photodetector of claim 2, wherein the initialization MOS transistor is controlled in strong-inversion state.

5. The photodetector of claim 2, wherein the measurement means includes:
    a measurement MOS transistor having a gate connected to the photodiode cathode; and
    a control MOS transistor connected in series with the measurement MOS transistor between a second supply voltage and read means.

6. The photodetector of claim 5, wherein the first and second supply voltages are equal.

7. A photodetector, comprising:
    a photodiode having an anode and a cathode, the anode being connected to a first reference voltage;
    a measurement circuit connected to the cathode and configured to measure a voltage of the cathode during a measurement phase; and
    a branching circuit having a first terminal connected to the first reference voltage, a second terminal connected to a second reference voltage, and a third terminal connected to the cathode, the branching circuit being structured to connect the cathode to the first reference voltage during a saturation phase and to connect the cathode to the second reference voltage during an initialization phase.

8. The photodetector of claim 7, further comprising a transistor having a first conduction terminal connected to the third terminal of the branching circuit, a second conduction terminal connected to the cathode, and a control terminal connected to an initialization signal, the transistor being structured to connect the third terminal of the branching circuit to the cathode during the initialization and saturation phases.

9. The photodetector of claim 7 wherein the photodetector is an amorphous silicon photodetector.

10. The photodetector of claim 7 wherein the measurement circuit includes a bias terminal connected to the second reference voltage, a control terminal connected to the cathode, and a read terminal connected to a reader for reading the measured voltage of the cathode.

11. The photodetector of claim 10 wherein the measurement circuit includes a measurement transistor having first conduction terminal connected to the second reference voltage, a second conduction terminal connected to the reader, and a control terminal connected to the cathode.

12. The photodetector of claim 11 wherein the measurement circuit further includes a selection transistor connected in series with the measurement transistor between the second reference voltage and the reader.

* * * * *